US008749313B2

(12) United States Patent
Ellis

(10) Patent No.: US 8,749,313 B2

(45) Date of Patent: Jun. 10, 2014

(54) CORRECTION OF LOW ACCURACY CLOCK

(75) Inventor: Andrew Ellis, Winchester (GB)

(73) Assignee: ST-Ericsson SA, Plan-les-Ouates (CH)

( * ) Notice: Subject to any disclaimer, the term of this patent is extended or adjusted under 35 U.S.C. 154(b) by 5 days.

(21) Appl. No.: 13/484,405

(22) Filed: May 31, 2012

(65) Prior Publication Data

US 2012/0306580 A1 Dec. 6, 2012

Related U.S. Application Data

(60) Provisional application No. 61/493,023, filed on Jun. 3, 2011.

(51) Int. Cl.
*H03L 7/06* (2006.01)

(52) U.S. Cl.
USPC .............. 331/2; 331/158; 331/46; 331/116 R; 331/116 FE

(58) Field of Classification Search
USPC ........................ 331/2, 46, 158, 116 R, 116 FE
See application file for complete search history.

(56) References Cited

U.S. PATENT DOCUMENTS

| | | | | |
|---|---|---|---|---|
| 4,899,117 A | 2/1990 | Vig | | |
| 6,650,189 B1 | 11/2003 | Romano | | |
| 7,315,489 B2 * | 1/2008 | Houldsworth | 368/120 | |
| 8,466,751 B2 * | 6/2013 | Simondin | 331/44 | |
| 8,630,386 B2 * | 1/2014 | Ellis | 377/30 | |
| 2005/0275475 A1 | 12/2005 | Houldsworth | | |

FOREIGN PATENT DOCUMENTS

| | | |
|---|---|---|
| EP | 0 768 583 A2 | 4/1997 |
| EP | 1 115 045 A2 | 7/2001 |

OTHER PUBLICATIONS

International Search Report and Written Opinion of the International Searching Authority issued in corresponding International application No. PCT/EP2012/060373, mailing date Aug. 16, 2012.

* cited by examiner

*Primary Examiner* — Arnold Kinkead
(74) *Attorney, Agent, or Firm* — Patent Portfolio Builders PLLC

(57) ABSTRACT

An electronic device has two oscillators, for example a first highly accurate crystal oscillator and a second less accurate low power oscillator. In a normal mode of operation, time is counted based on an output from the crystal oscillator, but in a low power mode of operation, time is counted based on an output from the less accurate oscillator. During the low power mode of operation, a calibration process is performed repeatedly. During a first calibration time period the second oscillator is calibrated against the first oscillator to obtain a first calibration result, and a recalibration is performed during a second calibration time period to obtain a second calibration result. A correction factor is determined from the first and second calibration results, and the correction factor is applied when subsequently counting time based on the output from the second oscillator.

30 Claims, 4 Drawing Sheets

CORRECTION OF LOW ACCURACY CLOCK

RELATED APPLICATIONS

This application is related to, and claims priority from U.S. Provisional Patent Application No. 61/493,023, entitled "Correction of Low Accuracy Clock", filed Jun 3, 2011, the disclosure of which is incorporated herein by reference.

This invention relates to an electronic device that uses an oscillator to count time. More specifically, the invention relates to a method of maintaining the count when the device is in a low power mode.

It is known, for example from U.S. Pat. No. 6,650,189, to use a crystal-based oscillator to generate timing signals in a portable device. It is also known to power down the crystal-based oscillator in a standby mode whenever possible, in order to extend the battery life of the device. When the device is in the standby mode, an alternative low-power oscillator is used to generate the required timing intervals. In addition, the low-power oscillator is calibrated against the crystal-based oscillator at regular intervals. The result of the calibration is then used during a subsequent inter-calibration period when the low-power oscillator is being used to generate the required timing intervals.

However, this has the disadvantage that a typical low-power oscillator not only has wide tolerances, but also drifts significantly with temperature and voltage. This has the effect that significant inaccuracies can build up in a counted time value that is derived from the low-power oscillator.

SUMMARY OF THE INVENTION

According to a first aspect of the present invention, there is provided a method of operation of an electronic device, having a first oscillator and a second oscillator, the method comprising:

in a normal mode of operation, counting time based on an output from the first oscillator; and in a low power mode of operation, counting time based on an output from the second oscillator; and further comprising, in the low power mode of operation, repeatedly:

calibrating the second oscillator against the first oscillator during a first calibration time period to obtain a first calibration result, recalibrating the second oscillator against the first oscillator during a second calibration time period to obtain a second calibration result, determining a correction factor from the first and second calibration results, and subsequently applying the correction factor when counting time based on the output from the second oscillator.

The step of determining the correction factor may comprise determining an expected calibration between the first and second oscillators for a period subsequent to the second calibration period, based on a difference between the first and second calibration results.

The method may further comprise, after subsequently applying the correction factor:

recalibrating the second oscillator against the first oscillator during a third calibration time period;

determining an error in the correction factor that had been applied subsequent to the second calibration time period; and determining, based on the determined error in the correction factor, a length of a first time to wait until performing a further recalibration.

The step of determining the length of the first time to wait may comprise increasing the first time to wait if the determined error in the correction factor is smaller than a first threshold, and may comprise decreasing the first time to wait if the determined error in the correction factor is larger than a second threshold.

The method may further comprise, after subsequently applying the correction factor:

recalibrating the second oscillator against the first oscillator during a third time period to obtain a third calibration result;

determining a second correction factor from the second and third calibration results;

determining a difference between the first and second correction factors; and determining, based on the determined difference between the first and second correction factors, a length of a second time to wait until a further recalibration.

The step of determining the length of the second time to wait until the further recalibration may comprise increasing the second time to wait if the determined difference between the first and second correction factors is smaller than a third threshold, and may comprise decreasing the second time to wait if the determined difference between the first and second correction factors is larger than a fourth threshold.

The method may comprise:

entering the low power mode of operation after expiry of a stabilization period following a powering down of the electronic device.

The method may further comprise, in the low power mode of operation:

powering down the first oscillator following each calibration.

When the electronic device is powered by a first power source, the method may further comprise:

detecting whether the first power source has been removed from the device; and if so, ceasing calibration of the second oscillator against the first oscillator until the first power source or a different power source has been inserted in place of the removed first power source.

The method may further comprise:

based on the correction factor determined from the first and second calibration results, applying a retrospective correction value to the time that was counted based on the output from the second oscillator during a time period between the second and third calibration periods.

According to a second aspect of the invention, there is provided an electronic device, having a first oscillator and a second oscillator, and comprising:

a counter, for counting time based on an output from the first oscillator in a normal mode of operation, and for counting time based on an output from the second oscillator in a low power mode of operation, and a processor for repeatedly, in the low power mode of operation:

calibrating the second oscillator against the first oscillator during a first time period to obtain a first calibration result, recalibrating the second oscillator against the first oscillator during a second time period, when a first inter-calibration period has expired, to obtain a second calibration result, determining a value of a correction factor from the first and second calibration results, and subsequently applying the correction factor when counting time based on the output from the second oscillator.

This has the advantage that a more accurate counted time value can be obtained.

In a third aspect of the invention provides a method of operation of an electronic device having a first oscillator and a second oscillator. The method comprises:

switching, at a beginning of a first calibration time period, the first oscillator on and calibrating the second oscillator against the first oscillator during the first calibration time period to obtain a first calibration result representing a first frequency of the second oscillator during the first calibration time period; and subsequently switching, at an end of the first calibration time period, the first oscillator off; and subsequently counting oscillations from the second oscillator, until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and providing a time parameter presenting a future point in time and, based on the first and second calibration results and on the first count of oscillations, estimating a second count of oscillations of the second oscillator to count after the end of the second calibration period in order to reach said future point in time;

counting oscillations from the second oscillator, until the second count is reached, and then initiating a first action.

Using this method, two calibrations are obtained, which gives information about the change in the frequency of the second oscillator from the first calibration time period to the second calibration time period. This therefore represents a drift in the frequency of the second oscillator. Based on this information, it is possible to more correctly relate the oscillations of the second oscillator to real time passed. Thus, if an event is to take place, say, 1 second after the second calibration, the first and second calibration results are easily used to calculate how many oscillations the second oscillator must go through in order for it to correspond to 1 second in real time. Note that knowing the first and second calibration results allows us to make a prediction of the future frequency of the second oscillator following the second calibration. Thus continued drift in the second oscillator is therefore easily taken into account when determining the number of oscillations for the second oscillator to go through.

In wireless communication systems, for instance, the method above can be included in a wireless telephone to allow the phone to go from a low-power mode where the first oscillator is switched off, to an active mode where a radio in the phone can communicate with the network, at a time that is more precise than what is possible with present methods.

The future point in time could be a beginning of a further calibration time period, and the first action is initiating a switching of the first oscillator in preparation for calibrating of the second oscillator against the first oscillator in order to obtain a further calibration result.

The time between the first and second calibration time periods, a first inter-calibration time, could be achieved by determining a first count which is equal to the first frequency of the second oscillator times the desired first inter-calibration time.

A fourth aspect of the invention provides a device corresponding to methods of the third aspect of the invention. Accordingly, the fourth aspect provides an electronic device comprising a first oscillator and a second oscillator, a counter for counting oscillations from the second oscillator;

a processor configured for:

switching, at a beginning of a first calibration time period, the first oscillator on and calibrating the second oscillator against the first oscillator during the first calibration time period to obtain a first calibration result representing a first frequency of the second oscillator during the first calibration time period; and subsequently switching, at an end of the first calibration time period, the first oscillator off; and subsequently causing oscillations from the second oscillator to be counted in the first counter until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and based on a time parameter presenting a future point in time and based on the first and second calibration results and on the first count of oscillations, estimating a second count of oscillations of the second oscillator to count after the end of the second calibration period in order to reach said future point in time, and;

causing a first action to be initiated when the second count is reached.

A fifth aspect of the invention provides another method of operation of an electronic device having a first oscillator and a second oscillator. The method comprises:

switching, if in a switched off state, at a beginning of a first calibration time period, the first oscillator on and calibrating the second oscillator against the first oscillator during the first calibration time period to obtain a first calibration result representing a first frequency of the second oscillator during the first calibration time period; and subsequently switching, at an end of the first calibration time period, the first oscillator off; and subsequently counting oscillations from the second oscillator, until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and switching, at a beginning of a third calibration time period, the first oscillator on and calibrating the second oscillator against the first oscillator during the third calibration time period to obtain a third calibration result representing a third frequency of the second oscillator during the third calibration time period; and subsequently switching, at an end of the third calibration time period, the first oscillator off; and determining, based on difference between the third calibration result and an expected third calibration result derived from the first and second calibration results, a length of a first time to wait until a further calibration time period.

This aspect allows for changing the period between calibration periods when three calibrations have been made. If the third calibration result differs from an expect calibration result, then the time to wait for a further calibration can be adjusted.

The expected third calibration result is typically derived via an extrapolation of the first and second calibration results towards the third calibration time period, for instance by linear extrapolation.

If a difference between the third frequency and a frequency corresponding to the expected third calibration result is smaller than a third threshold, then the step of determining the length of the first time to wait comprises increasing the first time to wait.

If a difference between the third frequency and a frequency corresponding to the expected third calibration result is larger than a fourth threshold, then the step of determining the length of the first time to wait comprises decreasing the first time to wait.

The electronic device could be powered by a removable power source, for instance a battery, and then it is advantageous to detect whether the power source is removed from the device. If so, the calibrating should be ceased. A reason is that the first oscillator needs to be switched off in order to conserve energy. Accordingly, any calibrating of the second oscillator against the first oscillator is ceased.

A sixth aspect of the invention provides a device corresponding to methods of the fifth aspect of the invention. Accordingly, the sixth aspect provides an electronic device comprising a first oscillator and a second oscillator, a counter for counting oscillations from the second oscillator;

a processor configured for:

switching, if in a switched off state, at a beginning of a first calibration time period, the first oscillator on and calibrating the second oscillator against the first oscillator during the first calibration time period to obtain a first calibration result representing a first frequency of the second oscillator during the first calibration time period; and subsequently switching, at an end of the first calibration time period, the first oscillator off; and subsequently causing oscillations from the second oscillator to be counted in the first counter until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and switching, at a beginning of a third calibration time period, the first oscillator on and calibrating the second oscillator against the first oscillator during the third calibration time period to obtain a third calibration result representing a third frequency of the second oscillator during the third calibration time period; and subsequently switching, at an end of the third calibration time period, the first oscillator off; and determining, based on difference between the third calibration result and an expected third calibration result derived from the first and second calibration results, a length of a first time to wait until a further calibration time period.

A seventh aspect of the invention is a method of determining a degree of temperature stability of an electronic device having a first oscillator and a second oscillator. The method comprises:

switching, if in a switched off state, at a beginning of a first calibration time period, the first oscillator on and calibrating the second oscillator against the first oscillator during the first calibration time period to obtain a first calibration result representing a first frequency of the second oscillator during the first calibration time period; and subsequently switching, at an end of the first calibration time period, the first oscillator off; and subsequently counting oscillations from the second oscillator, until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and switching, at a beginning of a third calibration time period, the first oscillator on and calibrating the second oscillator against the first oscillator during the third calibration time period to obtain a third calibration result representing a third frequency of the second oscillator during the third calibration time period; and subsequently switching, at an end of the third calibration time period, the first oscillator off; and determining the degree of temperature stability by comparing the first, second and third calibration results.

Drift in a frequency of the second oscillator in the electronic device might be due to temperature variations. At events such as powering down a mobile phone, a number of temperature changes occur, such as that of a chip that includes the second oscillator. This will cause a drift in the frequency of the second oscillator. By monitoring the temperature, it can be decided to count oscillations from the first oscillator for a period following the powering down, and then switch to the second oscillator when the temperature has settled. Then the first oscillator can be powered down as well.

Monitoring the temperature for stability can for instance be performed by comparing a rate of change associated with the first calibration result and the second result, and a rate of change associated with the second calibration result and third calibration result.

An eighth aspect of the invention provides a device corresponding to methods of the seventh aspect of the invention. Accordingly, the eighth aspect provides an electronic device comprising a first oscillator and a second oscillator, a counter for counting oscillations from the second oscillator;

a processor configured for:

switching, if in a switched off state, at a beginning of a first calibration time period, the first oscillator on and calibrating the second oscillator against the first oscillator during the first calibration time period to obtain a first calibration result representing a first frequency of the second oscillator during the first calibration time period; and subsequently switching, at an end of the first calibration time period, the first oscillator off; and subsequently causing oscillations from the second oscillator to be counted in the first counter until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and switching, at a beginning of a third calibration time period, the first oscillator on and calibrating the second oscillator against the first oscillator during the third calibration time period to obtain a third calibration result representing a third frequency of the second oscillator during the third calibration time period; and subsequently switching, at an end of the third calibration time period, the first oscillator off; and determining the degree of temperature stability by comparing the first, second and third calibration results.

As mentioned, the determining of the temperature stability is advantageously performed by monitoring the rate of change of the calibration results from one calibration to the next.

DETAILED DESCRIPTION

Figure 1:
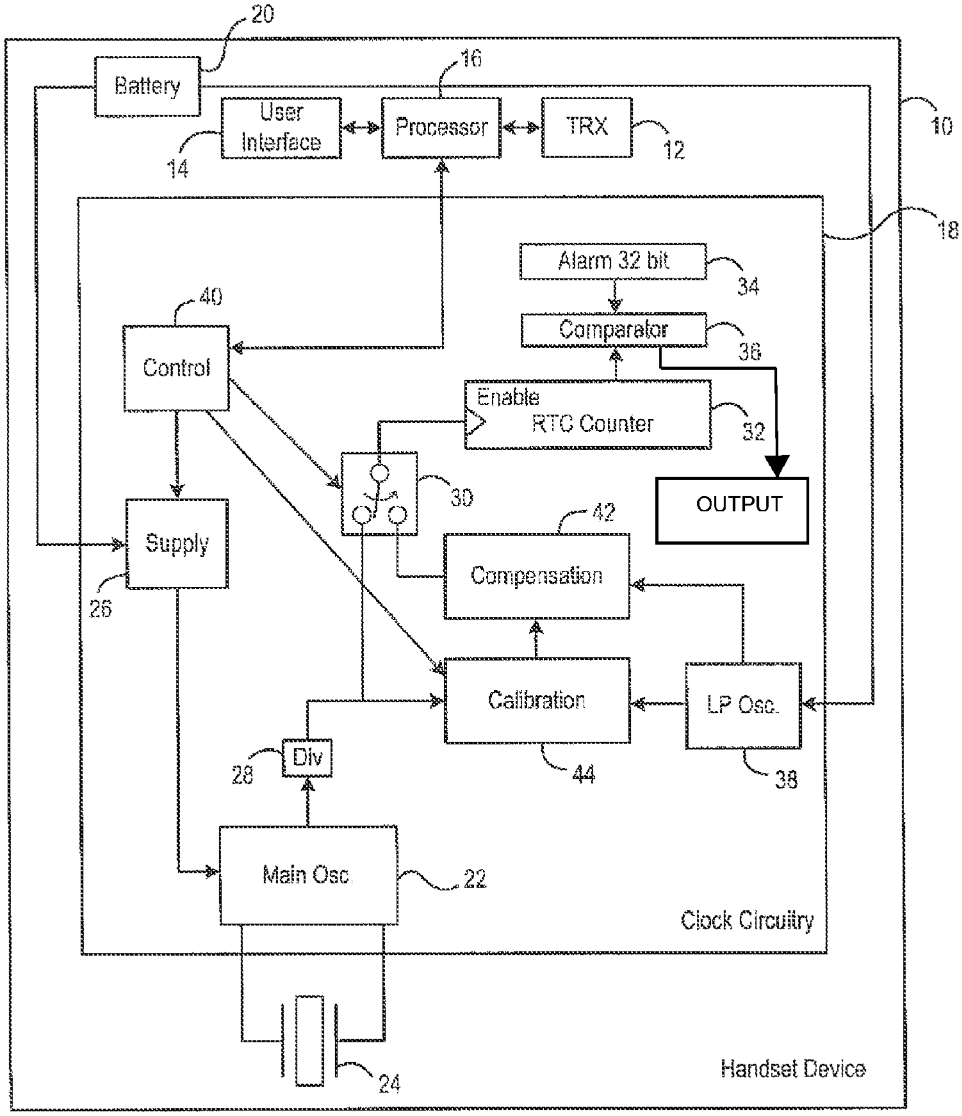
FIG. 1 is a block schematic diagram, illustrating an electronic device in accordance with an aspect of the invention.

FIG. 1 shows an electronic device, in the form of a communications handset device 10, such as a mobile phone, although the invention is equally applicable to any electronic device, for example such as a portable computer or the like.

In this example, where the electronic device is a communications handset device, it includes wireless transceiver circuitry (TRX) 12 and a user interface 14, such as a touch screen or such as separate keypad and display devices, both operating under the control of a processor 16.

The device 10 further includes clock circuitry 18, which is illustrated schematically in FIG. 1, and the device including the clock circuitry 18 is powered by a battery 20.

The clock circuitry 18 includes a first oscillator in the form of a main oscillator circuit 22, which generates clock signals at a known frequency with an accuracy that is acceptable for all purposes of the device 10, using an oscillator crystal 24. Battery power is provided to the main oscillator circuit 22 through a supply terminal 26.

In the operational mode of the device 10, the main oscillator circuit 22 is used for various purposes, including generating signals at the frequencies required for transmission and reception of radio frequency signals by the transceiver circuitry 12. This usage of the main oscillator circuit 22 is conventional, and will not be described in further detail.

In addition, the main oscillator circuit 22 is used to maintain a count that can be used as an indication of the time of day. Thus, a clock signal from the main oscillator circuit 22 is applied to a divider 28, to generate a signal at a known frequency, for example 32.768 kHz, and this known frequency signal is passed through a switch 30 to a real time clock (RTC) counter 32. The count value in the counter 32 at any moment can be used as an indication of the time of day. For example, if the user of the device wishes to set an alarm, the set alarm time can be converted to a 32 bit time value, and stored in a register 34. Set times for other alerting events generated within the device 10, such as waking up the device to check for paging events or other required background activities in standby mode, can also be stored in the register 34.

A comparator 36 then compares the alert time value stored in the register 34 with the count value in the counter 32. When these values are equal, it is determined that the time of day has reached the set alert time. In the case of an alarm set by the user, an alarm can be generated. In the case of an alerting event generated within the device 10, a signal can be generated to initiate the required action.

When the device is powered down, the main oscillator circuit 22 consumes too much power to be useful, and so power in a low power standby mode in an embodiment of the invention is supplied instead from the battery 20 to a second oscillator in the form of a low power oscillator circuit 38, which may for example be in the form of a resistor-capacitor (RC) circuit fully integrated with an Application Specific Integrated Circuit (ASIC) containing other components of the electronic device. The low power (LP) oscillator 38 generates a clock signal having a nominal frequency, but the low power oscillator 38 has wide tolerances, and moreover the actual frequency of the clock signal that it generates will typically drift significantly with both temperature and voltage. The calibration process described herein means that these inaccuracies can be compensated in use, without requiring any factory calibration process.

In the standby mode, a control circuit 40 causes the switch 30 to move to a second position, such that the clock signal from the low power oscillator 38, after passing through a compensation block 42, is passed to the RTC counter 32, and is used to maintain the count value representing the current time.

Periodically, the control circuit 40 causes a calibration block 44 to receive signals from the main oscillator 22 and from the low power oscillator 38 to obtain calibration results, as described in more detail below, and to generate a correction factor. The correction factor is applied to the compensation block 42, which then corrects the signals received from the low power oscillator 38, as also described in more detail below, before they are applied to the RTC counter 32.

Figure 2:
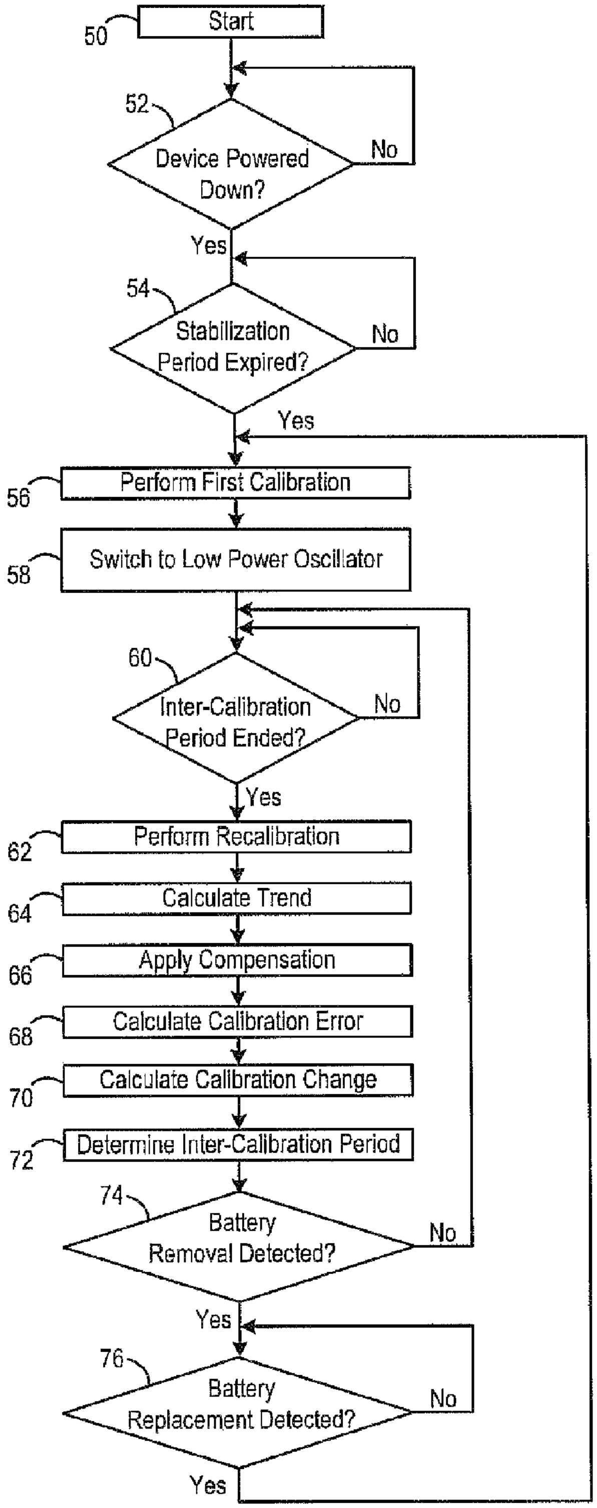
FIG. 2 is a flow chart, illustrating a method in accordance with an aspect of the invention.

FIG. 2 is a flow chart, illustrating in more detail the process performed by the clock circuitry 18, under the control of the control circuit 40, in order to ensure that the time counted by the counter 32 remains accurate.

The process starts at step 50, at which time it is assumed that the device is in a normal mode of operation, with power being supplied to all active components of the device, including the main oscillator circuit 22. In step 52, it is tested whether the device has been powered down, i.e. whether it has entered a standby, or low power, mode of operation, and this step is repeated until it is found that it has entered the standby mode. When the device is first powered down, power supply to the main oscillator circuit 22 is maintained.

At that time, the process passes to step 54, in which it is determined whether a stabilization period has expired, and this step is repeated until it is found that the stabilization period has expired. When the device is first powered down, power will be removed from a number of heat generating components of the device that might for example share the same die as the low power oscillator 38. This will mean that, at this time, the low power oscillator 38 will be in an unstable temperature environment. Moreover, when power is removed from various components, the voltage supplied by the battery 20 to the low power oscillator 38 will potentially be less stable, and this would also tend to cause variations in the frequency of the clock signal generated by the low power oscillator 38.

It is therefore preferred that the main oscillator circuit 22 should continue to be used as the basis for counting the time during this stabilization period, which might perhaps last for one minute. After the stabilization period has ended, the temperature of the low power oscillator 38 might remain above the ambient temperature, but it can at least be assumed that the rate of change of its temperature will have settled. In other embodiments, any variation in the frequency of the clock signal generated by the low power oscillator 38 might be ignored or compensated, and step 54 might be omitted.

When it is found in step 54 that the stabilization period has expired, the process passes to step 56. In step 56, a first calibration is performed. That is, the frequency of the clock signal generated by the low power oscillator circuit is measured, using the clock signal generated by the main oscillator circuit 22 as a reference.

Figure 3:
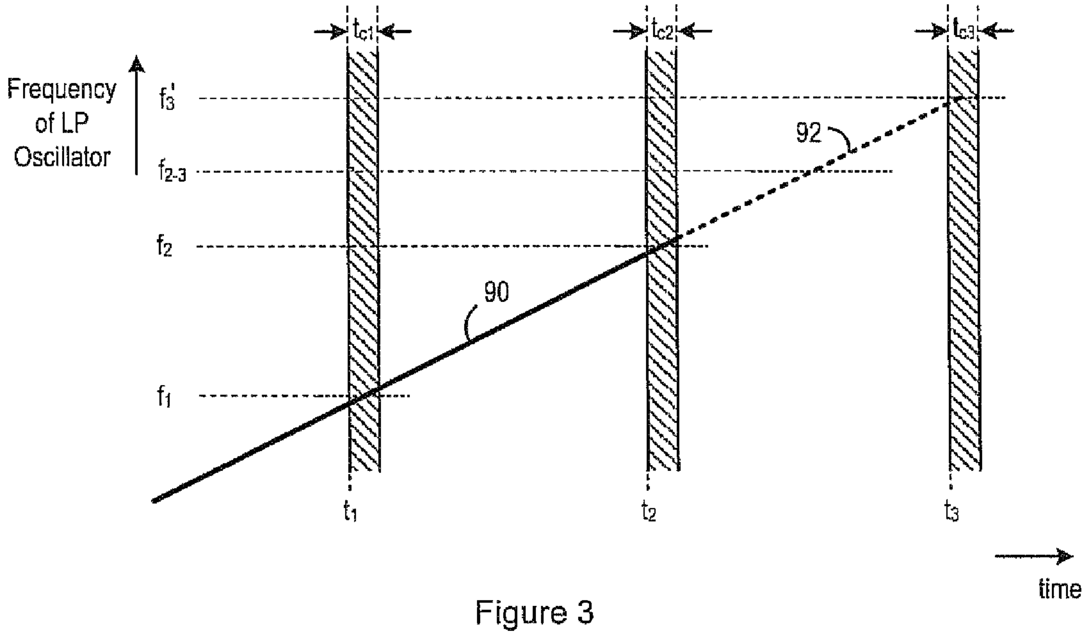
FIG. 3 is a time history illustrating a stage in the method of FIG. 2.
Figure 4:
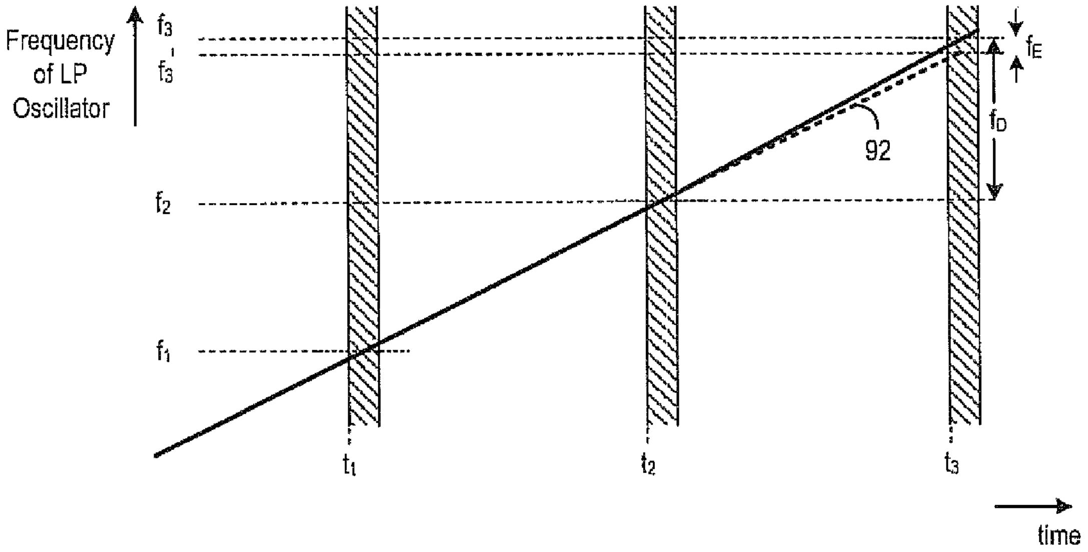
FIG. 4 is a time history illustrating a further stage in the method of FIG. 2.

FIGS. 3 and 4 are time histories, further illustrating the method of FIG. 2. Thus, FIGS. 3 and 4 show the frequency of the clock signal generated by the low power oscillator circuit, as measured with reference to the clock signal generated by the main oscillator circuit 22, at different times.

Thus, in this illustrated example, the frequency of the clock signal generated by the low power oscillator circuit is measured over a first calibration time period $t_{c1}$, which might for example have a duration of 10 ms, starting at the first calibration time $t_1$. As shown in FIG. 3, the frequency is found during this first calibration time period to be $f_1$. Thus, it is assumed that the clock signal generated by the main oscillator circuit 22 has the intended reference frequency, and the value of the frequency $f_1$ of the clock signal generated by the low power oscillator circuit is found by comparison of the frequencies of the two clock signals.

When the first calibration has been completed, the process passes to step 58, in which the power is removed from the main oscillator circuit 22, and the switch 30 is switched, allowing the low power oscillator 38 to be used as the input to the counter 32. At this time, it can only be assumed that the clock signal generated by the low power oscillator circuit remains at the frequency $f_1$, and so any drift in this frequency will inevitably cause small errors to accumulate in the counted time value stored in the counter 32.

An initial value, for example 30 seconds, is set for the inter-calibration period, i.e. the time between calibrations, and it is tested in step 60 whether this inter-calibration period has expired, with step 60 being repeated until it is found that the inter-calibration period has expired.

At this second calibration time, denoted by time $t_2$ in FIG. 3, the process passes to step 62, and a recalibration is performed during a second calibration time period $t_{c2}$. Thus, power is reapplied to the main oscillator circuit 22, and the frequency of the clock signal generated by the low power oscillator circuit 38 is measured over a second calibration time period $t_{c2}$, starting at the second calibration time $t_2$. By comparison of the frequency of the clock signal generated by the low power oscillator circuit 38 with the frequency of the clock signal generated by the main oscillator circuit 22, and by assuming that the clock signal generated by the main oscillator circuit 22 has the intended reference frequency, it is found during this second calibration time period that the frequency of the clock signal generated by the low power oscillator circuit 38 is $f_2$. The calibration can be performed using the clock pulses provided by the divider 28, or alternatively the clock pulses from the main oscillator circuit 22 can be passed directly to the calibration block 44 as this might allow a sufficiently accurate calibration result to be achieved more quickly than by using the lower frequency clock pulses from the divider 28.

When the second calibration has been completed, power is removed from the main oscillator circuit 22.

The process then passes to step 64, in which the trend of the first and second calibrations is calculated. Thus, with the frequency measured as $f_1$ at time $t_1$, and as $f_2$ at time $t_2$, it is assumed that the frequency is increasing at a constant rate of $(f_2-f_1)/(t_2-t_1)$, as shown by the solid line 90 in FIG. 3. This trend is then used to estimate a frequency of the clock signal that will be generated by the low power oscillator circuit 38 over the forthcoming inter-calibration period.

Knowing that the next calibration is scheduled to occur at the third calibration time $t_3$, the duration $(t_3-t_2)$ of the inter-calibration period is known, and an expected value can be found for the frequency of the clock signal generated by the low power oscillator circuit 38 during that inter-calibration period. For example, if it is assumed that the frequency of the clock signal is changing in a linear way, and that this change will continue, reaching a frequency $f_3'$ at the third calibration time $t_3$ as shown by the dotted line 92 in FIG. 3, the average frequency $f_{2-3}$ during the inter-calibration period can be calculated. Specifically:

$$f_{2-3} = f_2 + \frac{(t_3 - t_2)}{2} \cdot \frac{(f_2 - f_1)}{(t_2 - t_1)}$$

The process then passes to step 66, in which compensation is applied during the inter-calibration period between the second calibration time $t_2$ and the third calibration time $t_3$. Thus, while a clock signal is being generated by the low power oscillator 38, the compensation block 42 applies a correction factor to take account of the fact that the clock pulses being generated by the low power oscillator 38 are assumed during this inter-calibration period to be generated at the frequency $f_{2-3}$. For example, the compensation block 42 can divide the frequency of the clock pulses generated by the low power oscillator 38 by a known division ratio, and this division ratio can be controlled based on the required correction factor. The compensated pulses are then counted in the RTC counter 32 and used to indicate the time.

In a first pass through the process, steps 68, 70 and 72 are not performed, and so these steps are ignored at this point.

In step 74, it is determined whether the battery 20 has been removed from the device. If so, the process passes to step 76, in which it is determined whether the battery has been replaced in the device. If the battery is removed, the calibration process shown in FIG. 3 is stopped to save power, and when the battery is replaced the calibration process starts again by returning to step 56.

However, if it is determined in step 74 that the battery has not been removed, the process returns to step 60. In step 60, it is determined whether the inter-calibration period has expired, i.e. whether the third calibration time $t_3$ has been reached.

When the third calibration time $t_3$ has been reached, the process passes to step 62, and a further recalibration is performed as described above during a third calibration time period $t_{c3}$. In the situation illustrated in FIG. 4, the recalibration performed at the third calibration time $t_3$ finds that the frequency of the clock signal generated by the low power oscillator 38 is $f_3$. As before, a trend is calculated in step 64, and this trend is used to determine a correction factor that is applied in step 66 during the inter-calibration period following the third calibration time period.

This use of a trend to derive an expected calibration during a future time period allows an accurate time count value to be maintained, even in the presence of a drift in the frequency characteristics of the low power oscillator 38.

Thus, in this illustrated embodiment, it is assumed that the frequency of the clock signal generated by the low power oscillator 38 varies linearly with time (at least over time scales comparable with the durations of the inter-calibration time periods). This is usually an acceptable assumption where, as here, there are no active heat sources in close proximity to the low power oscillator and the low power oscillator is mounted within the device 10 and shielded to some extent from the ambient temperature.

However, it also possible in step 64 to assume a non-linear trend by using more than two calibration results. For example, by examining three calibration results, such as the frequencies $f_1$, $f_2$ and $f_3$ obtained at the times $t_1$, $t_2$ and $t_3$, it is possible to derive an assumed quadratic relationship between the frequency and the time. It can then be assumed that this relationship will persist until the next calibration period, and to calculate an average frequency for the inter-calibration period on that basis. Compensation during that inter-calibration period can then be applied in step 66 using that calculated average frequency.

In step 68, when the third calibration result $f_3$ has been obtained, this can be used to derive a measure of the error resulting from the previous calibration. Specifically, it was mentioned above that it was assumed on the basis of the second calibration during the time period $t_{c2}$ that the frequency of the clock signal would change in a linear way, reaching an expected frequency $f_3'$ at the third calibration time $t_3$ as shown by the dotted line 92 in FIGS. 3 and 4. When the third calibration result $f_3$ is obtained, it is possible to compare the calibration result with the expected frequency, for example forming a frequency calibration error $f_E=(f_3'-f_3)$. This is equivalent to determining an error in the correction factor derived at the second calibration time $t_2$.

In addition, or alternatively, the third calibration result $f_3$ can be used in step 70 to derive a measure of the change since the previous calibration. Specifically, when the third calibration result $f_3$ is obtained, it is possible to compare this calibration result with the previous calibration result, for example forming a frequency calibration difference $f_D=(f_3-f_2)$. This is equivalent to determining a difference between the correction factors derived at the second and third calibration times $t_2$ and $t_3$.

The value of the frequency calibration error $f_E$ and/or the value of the frequency calibration difference $f_D$ can be used in step 72 to determine the optimum duration of future inter-calibration periods. It is necessary to perform frequency recalibrations sufficiently often to maintain the requisite accuracy of the compensation, so that the time value stored in the RTC counter 32 is acceptably accurate, but otherwise it is desirable to save power by maximizing the time between recalibrations.

For example, if the frequency calibration error $f_E$ and/or the frequency calibration difference $f_D$ is found to be greater than a respective threshold, the duration of future inter-calibration periods could be reduced compared with the current duration, while if the frequency calibration error $f_E$ and/or the frequency calibration difference $f_D$ is found to be less than a respective threshold, the duration of future inter-calibration periods could be increased compared with the current duration.

In addition, the frequency calibration error $f_E$ can be used if desired to determine a retrospective time compensation value. That is, as described above, the calibration value obtained in the second calibration time period $t_{c2}$ was used to calculate an expected frequency $f_3'$ at the third calibration time $t_3$, and this was in turn used to derive an expected average frequency $f_{2-3}$ during the inter-calibration period between $t_2$ and $t_3$. The signals generated by the low power oscillator 38 were then compensated on that basis during the inter-calibration period between $t_2$ and $t_3$. However, if it is found in the third calibration time period $t_{c3}$ that the actual frequency value $f_3$ differs from the expected frequency $f_3'$, this suggests that the compensation performed during the inter-calibration period between $t_2$ and $t_3$ was not ideal. It is thus possible to calculate the degree of under-compensation or over-compensation performed during the previous inter-calibration period, and to apply a retrospective compensation to the count value stored in the RTC counter 32, either by generating additional pulses or by inhibiting a certain number of pulses, as required.

The process illustrated in FIG. 2 can then be repeated as often as required. Thus, when the process is first performed, the first and second calibration results are used to generate a first correction factor that is applied in the period subsequent to the second calibration time, and the third calibration result is used in determining the error and/or difference measures described above. At the same time, the second and third calibration results are used to generate a new first correction factor that is to be applied in the period subsequent to the third calibration time, and thereafter a fourth calibration result is used in determining the error and/or difference measures.

There is therefore described a method for calibrating a clock signal that allows the use of a relatively inexpensive and low power oscillator to generate a time count value of acceptably high accuracy.

Figure 5:
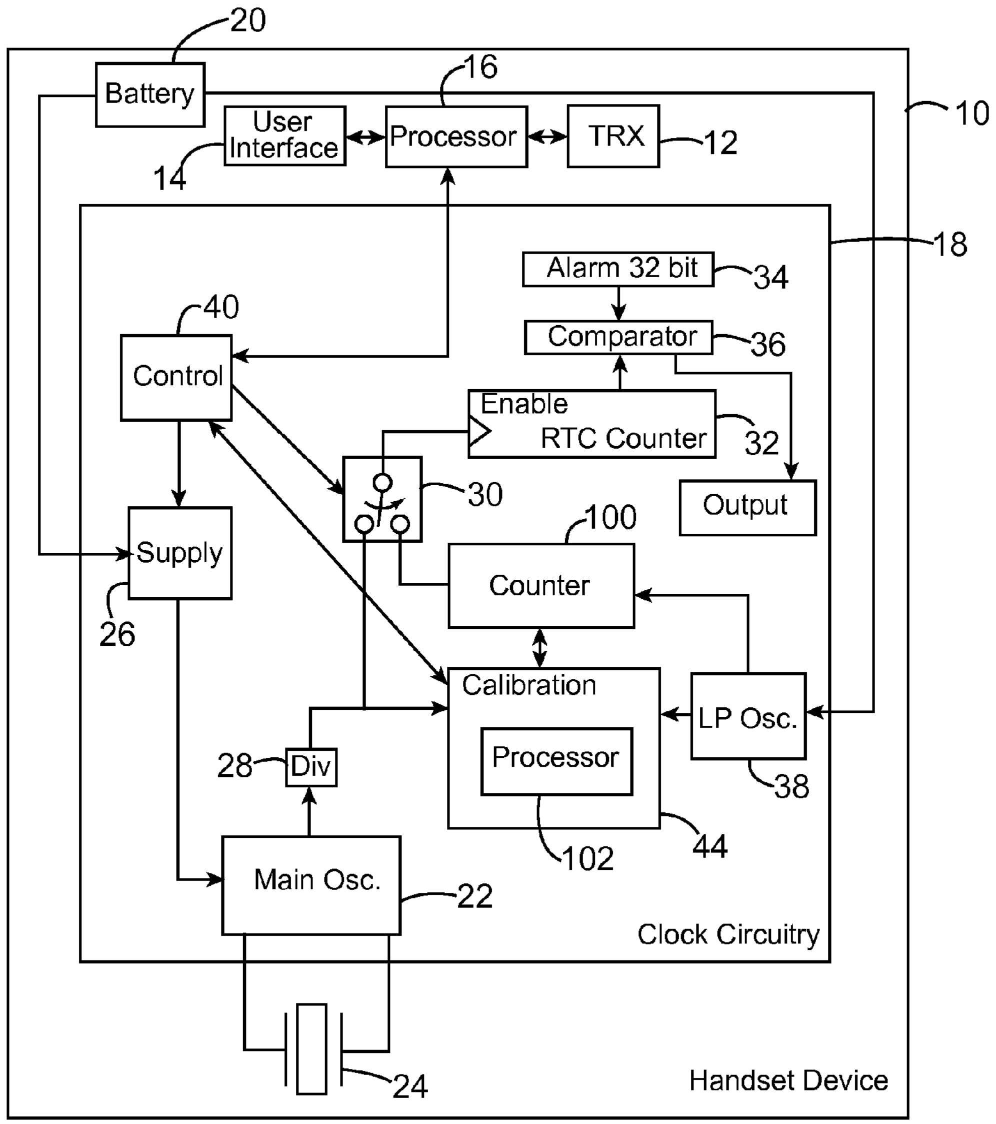
FIG. 5 illustrates another electronic device in accordance with an aspect of the invention.

FIG. 5 illustrates an alternative electronic device. The schematic illustrates features already described. However, it also includes a counter 100 for counting oscillations from the second oscillator 38. In between calibrations of the second oscillator against the first oscillator, the counter keeps count of the oscillations from the second oscillator. Calibration periods provide a relationship between the first and the second oscillators during the calibration time period, and thus in a following calibration time period, or for another purpose, the relationship can be used to determine much more precisely what the count of oscillations translate into, had the counting been performed by the first, more precise oscillator.

A processor 102 in the system, which is shown in FIG. 5 in the calibration block 44 (but which may alternatively be in the controller block 40, or any other place where it can fit in), can be used to translate a time parameter, for instance 1 s, into a number representing how many oscillations the second oscillator must go through for it to reflect the time parameter, here 1 s for illustration.

Thus, if it is known that some further action must be initiated (for example, that communication with the network must be initiated) at a specific time in the future, the relationship between the first and second oscillators can be used to predict how many oscillations of the second oscillator will occur before that specific time. The count of these oscillations maintained in the counter 100 can be used to determine when this specific future point in time has been reached.

The processor can be further or alternatively be configured for methods in accordance with other aspects of the invention, as will be readily recognized by a person of normal skill in the art.

The invention claimed is:

1. A method of operation of an electronic device, having a first oscillator and a second oscillator, the method comprising:
- in a normal mode of operation, counting time based on an output from the first oscillator; and
- in a low power mode of operation, counting time based on an output from the second oscillator; and further comprising, in the low power mode of operation, repeatedly:
- calibrating the second oscillator against the first oscillator during a first calibration time period to obtain a first calibration result,
- recalibrating the second oscillator against the first oscillator during a second calibration time period to obtain a second calibration result,
- determining a correction factor from the first and second calibration results, and
- subsequently applying the correction factor when counting time based on the output from the second oscillator.

2. A method as claimed in claim 1, wherein the step of determining the correction factor comprises determining an expected calibration between the first and second oscillators for a period subsequent to the second calibration period, based on a difference between the first and second calibration results.

3. A method as claimed in claim 1, further comprising, after subsequently applying the correction factor:
- recalibrating the second oscillator against the first oscillator during a third calibration time period;
- determining an error in the correction factor that had been applied subsequent to the second calibration time period; and
- determining, based on the determined error in the correction factor, a length of a first time to wait until performing a further recalibration.

4. A method as claimed in claim 3, wherein the step of determining the length of the first time to wait comprises increasing the first time to wait if the determined error in the correction factor is smaller than a first threshold.

5. A method as claimed in claim 3, wherein the step of determining the length of the first time to wait comprises decreasing the first time to wait if the determined error in the correction factor is larger than a second threshold.

6. A method as claimed in claim 1, further comprising, after subsequently applying the correction factor:
- recalibrating the second oscillator against the first oscillator during a third time period to obtain a third calibration result;
- determining a second correction factor from the second and third calibration results;
- determining a difference between the first and second correction factors; and
- determining, based on the determined difference between the first and second correction factors, a length of a second time to wait until a further recalibration.

7. A method as claimed in claim 6, wherein the step of determining the length of the second time to wait until the further recalibration comprises increasing the second time to wait if the determined difference between the first and second correction factors is smaller than a third threshold.

8. A method as claimed in claim 6, wherein the step of determining the length of the second time to wait comprises decreasing the second time to wait if the determined difference between the first and second correction factors is larger than a fourth threshold.

9. A method as claimed in claim 1, comprising:
- entering the low power mode of operation after expiry of a stabilization period following a powering down of the electronic device.

10. A method as claimed in claim 1, further comprising, in the low power mode of operation:
- powering down the first oscillator following each calibration.

11. A method as claimed in claim 1, wherein the electronic device is powered by a first power source, further comprising:
- detecting whether the first power source has been removed from the device; and
- if so, ceasing calibration of the second oscillator against the first oscillator until the first power source or a different power source has been inserted in place of the removed first power source.

12. A method as claimed in claim 1, further comprising:
- based on the correction factor determined from the first and second calibration results, applying a retrospective correction value to the time that was counted based on the output from the second oscillator during a time period between the second and third calibration periods.

13. An electronic device, having a first oscillator and a second oscillator, and comprising:
- a counter, for counting time based on an output from the first oscillator in a normal mode of operation, and for counting time based on an output from the second oscillator in a low power mode of operation, and
- a processor for repeatedly, in the low power mode of operation:
- calibrating the second oscillator against the first oscillator during a first time period to obtain a first calibration result,
- recalibrating the second oscillator against the first oscillator during a second time period, when a first inter-calibration period has expired, to obtain a second calibration result,
- determining a value of a correction factor from the first and second calibration results, and
- subsequently applying the correction factor when counting time based on the output from the second oscillator.

14. An electronic device as claimed in claim 13, wherein the first oscillator is a crystal oscillator.

15. An electronic device as claimed in claim 13, wherein the second oscillator is a low power RC oscillator.

16. A method of operation of an electronic device having a first oscillator and a second oscillator, the method comprising:
- switching, at a beginning of a first calibration time period, the first oscillator on and calibrating the second oscillator against the first oscillator during the first calibration time period to obtain a first calibration result representing a first frequency of the second oscillator during the first calibration time period; and subsequently
- switching, at an end of the first calibration time period, the first oscillator off; and subsequently counting oscillations from the second oscillator, until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and providing a time parameter presenting a future point in time and, based on the first and second calibration results and on the first count of oscillations, estimating a second count of oscillations of the second oscillator to count after the end of the second calibration period in order to reach said future point in time;

counting oscillations from the second oscillator, until the second count is reached, and then initiating a first action.

17. A method in accordance with claim 16, wherein the electronic device is configurable to communicate with a communications network, and the first action is to initiate a communication with the communications network.

18. A method in accordance with claim 16, wherein the future point in time is a beginning of a further calibration time period, and the first action is initiating switching the first oscillator on and calibrating of the second oscillator against the first oscillator in order to obtain a further calibration result.

19. A method in accordance with claim 16, wherein the first count is determined as the first frequency of the second oscillator times a first inter-calibration time.

20. A method of operation of an electronic device having a first oscillator and a second oscillator, the method comprising:

switching, if in a switched off state, at a beginning of a first calibration time period, the first oscillator on and calibrating the second oscillator against the first oscillator during the first calibration time period to obtain a first calibration result representing a first frequency of the second oscillator during the first calibration time period; and subsequently switching, at an end of the first calibration time period, the first oscillator off; and subsequently counting oscillations from the second oscillator, until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and switching, at a beginning of a third calibration time period, the first oscillator on and calibrating the second oscillator against the first oscillator during the third calibration time period to obtain a third calibration result representing a third frequency of the second oscillator during the third calibration time period; and subsequently switching, at an end of the third calibration time period, the first oscillator off; and determining, based on difference between the third calibration result and an expected third calibration result derived from the first and second calibration results, a length of a first time to wait until a further calibration time period.

21. A method in accordance with claim 20, wherein the expected third calibration result is derived via an extrapolation of the first and second calibration results towards the third calibration time period.

22. A method in accordance with claim 21, wherein the extrapolation is a linear extrapolation.

23. A method as claimed in claim 20, wherein the step of determining the length of the first time to wait comprises increasing the first time to wait if a difference between the third frequency and a frequency corresponding to the expected third calibration result is smaller than a third threshold.

24. A method as claimed in claim 20, wherein the step of determining the length of the first time to wait comprises decreasing the first time to wait if a difference between the third frequency and a frequency corresponding to the expected third calibration result is larger than a fourth threshold.

25. A method as claimed in claim 16, wherein the electronic device is powered by a first power source, further comprising:

detecting whether the first power source has been removed from the device; and if so, ceasing calibrating the second oscillator against the first oscillator until the first power source or a different power source has been inserted in place of the removed first power source.

26. A method of determining a degree of temperature stability of an electronic device having a first oscillator and a second oscillator, the method comprising:

switching, if in a switched off state, at a beginning of a first calibration time period, the first oscillator on and calibrating the second oscillator against the first oscillator during the first calibration time period to obtain a first calibration result representing a first frequency of the second oscillator during the first calibration time period; and subsequently switching, at an end of the first calibration time period, the first oscillator off; and subsequently counting oscillations from the second oscillator, until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and switching, at a beginning of a third calibration time period, the first oscillator on and calibrating the second oscillator against the first oscillator during the third calibration time period to obtain a third calibration result representing a third frequency of the second oscillator during the third calibration time period; and subsequently switching, at an end of the third calibration time period, the first oscillator off; and determining the degree of temperature stability by comparing the first, second and third calibration results.

27. A method in accordance with claim 26, wherein the degree of temperature stability is estimated by comparing:

1) a rate of change associated with the first calibration result and the second result, and:

2) a rate of change associated with the second calibration result and third calibration result.

28. An electronic device comprising:

a first oscillator and a second oscillator, a counter for counting oscillations from the second oscillator;

a processor configured for:

switching, at a beginning of a first calibration time period, the first oscillator on and calibrating the second oscillator against the first oscillator during the first calibration time period to obtain a first calibration result representing a first frequency of the second oscillator during the first calibration time period; and subsequently switching, at an end of the first calibration time period, the first oscillator off; and subsequently causing oscillations from the second oscillator to be counted in the first counter until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and based on a time parameter presenting a future point in time and based on the first and second calibration results and on the first count of oscillations, estimating a second count of oscillations of the second oscillator to count after the end of the second calibration period in order to reach said future point in time, and;

causing a first action to be initiated when the second count is reached.

29. An electronic device comprising:

a first oscillator and a second oscillator, a counter for counting oscillations from the second oscillator;

a processor configured for:

switching, if in a switched off state, at a beginning of a first calibration time period, the first oscillator on and calibrating the second oscillator against the first oscillator during the first calibration time period to obtain a first calibration result representing a first frequency of the second oscillator during the first calibration time period; and subsequently switching, at an end of the first calibration time period, the first oscillator off; and subsequently causing oscillations from the second oscillator to be counted in the first counter until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and switching, at a beginning of a third calibration time period, the first oscillator on and calibrating the second oscillator against the first oscillator during the third calibration time period to obtain a third calibration result representing a third frequency of the second oscillator during the third calibration time period; and subsequently switching, at an end of the third calibration time period, the first oscillator off; and determining, based on difference between the third calibration result and an expected third calibration result derived from the first and second calibration results, a length of a first time to wait until a further calibration time period.

30. An electronic device comprising:

a first oscillator and a second oscillator, a counter for counting oscillations from the second oscillator;

a processor configured for:

switching, if in a switched off state, at a beginning of a first calibration time period, the first oscillator on and calibrating the second oscillator against the first oscillator during the first calibration time period to obtain a first calibration result representing a first frequency of the second oscillator during the first calibration time period; and subsequently switching, at an end of the first calibration time period, the first oscillator off; and subsequently causing oscillations from the second oscillator to be counted in the first counter until a first count is reached; and subsequently switching, at a beginning of a second calibration time period, the first oscillator on and calibrating the second oscillator against the first oscillator during the second calibration time period to obtain a second calibration result representing a second frequency of the second oscillator during the second calibration time period; and switching, at an end of the second calibration time period, the first oscillator off; and switching, at a beginning of a third calibration time period, the first oscillator on and calibrating the second oscillator against the first oscillator during the third calibration time period to obtain a third calibration result representing a third frequency of the second oscillator during the third calibration time period; and subsequently switching, at an end of the third calibration time period, the first oscillator off; and determining the degree of temperature stability by comparing the first, second and third calibration results.

* * * * *